United States Patent [19]
Ohshima et al.

[11] Patent Number: 5,908,324
[45] Date of Patent: Jun. 1, 1999

[54] SOCKET FOR ELECTRIC PARTS

[75] Inventors: Hisao Ohshima, Kitamoto; Takayuki Yamada, Gyoda; Toshihiko Sekiguchi, Tokyo, all of Japan

[73] Assignee: Enplas Corporation, Kawaguchi, Japan

[21] Appl. No.: 08/821,756

[22] Filed: Mar. 20, 1997

[30] Foreign Application Priority Data

| Mar. 22, 1996 | [JP] | Japan | 8-066033 |
| Mar. 26, 1996 | [JP] | Japan | 8-070455 |
| Mar. 27, 1996 | [JP] | Japan | 8-072562 |
| Mar. 29, 1996 | [JP] | Japan | 8-076782 |
| Dec. 18, 1996 | [JP] | Japan | 8-338384 |

[51] Int. Cl.$^6$ .................................................. H01R 11/22
[52] U.S. Cl. ............................................ 439/266; 439/68
[58] Field of Search ........................ 439/68–73, 264–269, 439/330, 331, 525, 526

[56] References Cited

U.S. PATENT DOCUMENTS

| 4,691,975 | 9/1987 | Fukunaga et al. . | |
| 4,801,273 | 1/1989 | Ikeya et al. | 439/266 X |
| 5,009,609 | 4/1991 | Matsuoka et al. . | |
| 5,076,798 | 12/1991 | Uratsuji | 439/269 |
| 5,108,302 | 4/1992 | Pfaff et al. . | |
| 5,318,456 | 6/1994 | Mori | 439/266 |
| 5,354,206 | 10/1994 | Mori | 439/68 |

*Primary Examiner*—Khiem Nguyen
*Attorney, Agent, or Firm*—Pillsbury Madison & Sutro LLP

[57] ABSTRACT

A socket for electric parts is equipped with a socket body having a mounting face on which an electric part is mounted; contact pins fixed on the socket body, each having a contact portion, a trigger portion, and a spring portion; and a cover mounted on the socket body, free to move up and down. The end edge of the contact portion contacts a corresponding lead of the electric part and is configured to incline with respect to the end edge of the lead. The trigger portion and the spring portion are configured to project toward the center of the socket body. The width of the spring portion projecting toward the center of the socket body is such as to increase progressively in going to the base portion of the contact pin. In this way, a high pressure of contact between the lead and the contact pin and a sufficient wiping action are ensured, and a socket for electric parts capable of continued high performance over a long period of time is provided.

13 Claims, 8 Drawing Sheets

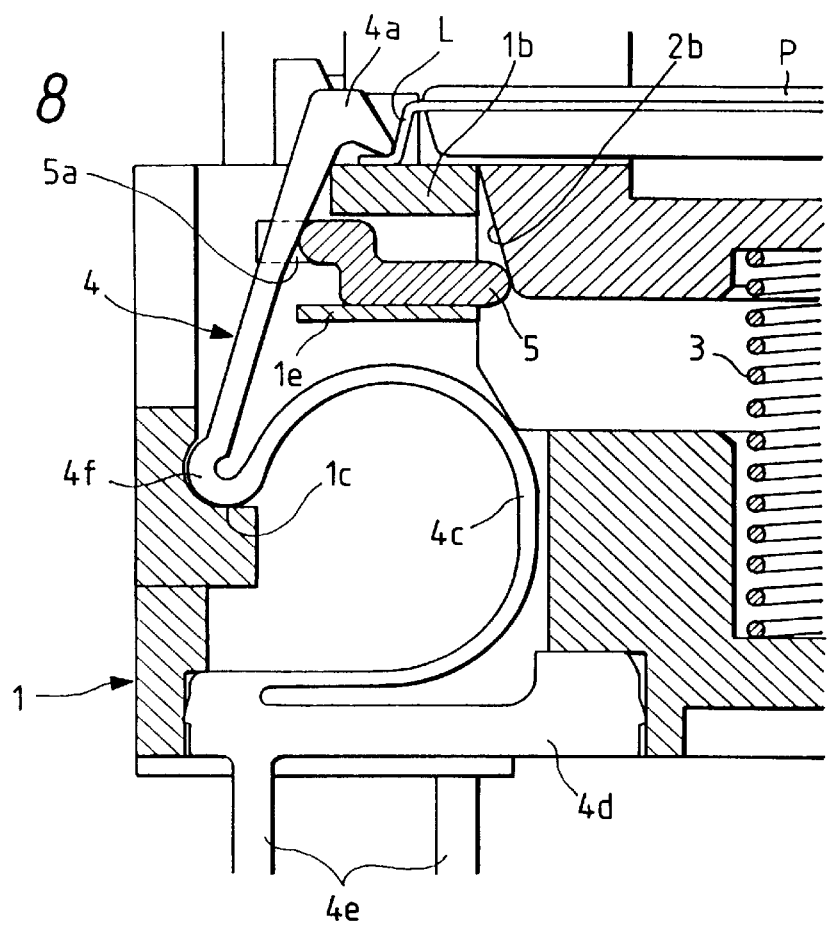
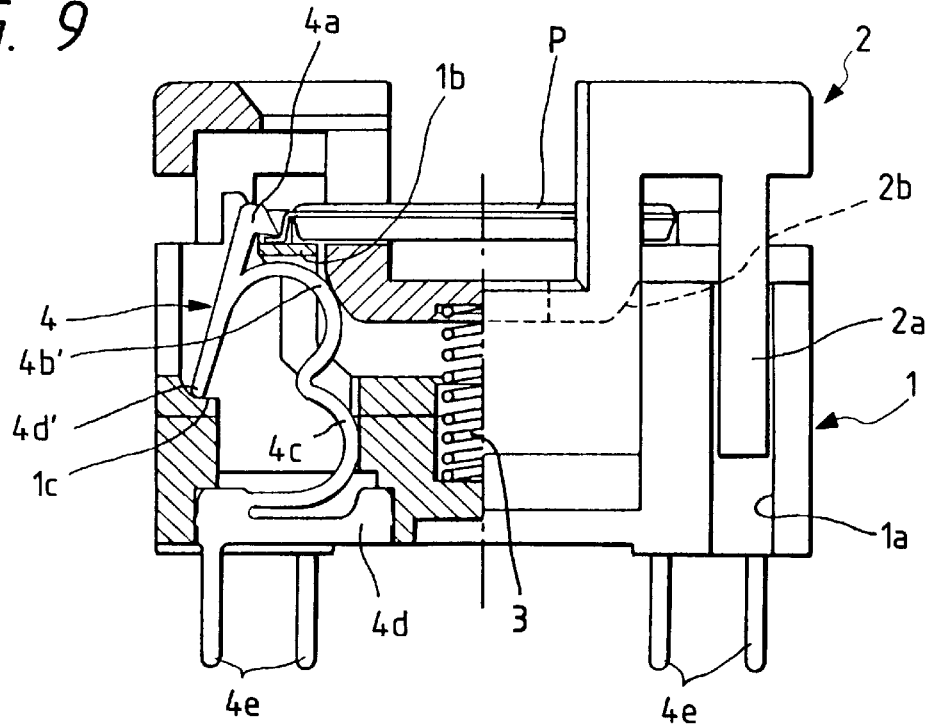

SOCKET FOR ELECTRIC PARTS

BACKGROUND OF THE INVENTION

1. Field of the Invention

This invention relates to a socket for electric parts which is used for the testing of electric parts, such as IC packages, and a mounting to a circuit substrate.

2. Description of the Prior Art

What is called an open-top type socket for electric parts has been known in the past, and its structure is rich in variety. This socket is equipped with a socket body having a mounting face for mounting an electric part thereon; numerous contact pins arranged in the socket body, each having a base portion, a contact portion, a trigger portion, and an arcuate spring portion; and a cover put on the socket body, free to move up and down. Each contact pin is moved outwardly against its biasing force through the trigger portion pushed by the downward pressure of the cover so that the electric part can be mounted on the mounting face from above the cover. By releasing the pressure from the cover pressed down, the contact pin is returned to its original position to press the contact portion of the contact pin against each of leads of the electric part placed on the mounting face of the socket body.

FIG. 1 is a left-hand sectional side view showing an example of the socket mentioned above. In this figure, reference numeral 1 denotes a socket body of rectangular plane shape, having a guide groove 1a piercing the socket body vertically and a mounting base 1b; 2 denotes a cover of bilaterally symmetrical frame shape, having a pillar 2a inserted to slide freely in the guide groove 1a and a cam 2b along which a part of each of contact pins described later slides; 3 denotes a spring imparting the biasing force of an upward movement to the cover 2; 4 denotes contact pins, each having a contact portion 4a, a trigger portion 4b sliding along the cam 2b of the cover 2, an arcuate spring portion 4c, a base portion 4d interposed between respective two of numerous insulating ribs configured in the socket body 1, and connecting terminals 4e inserted and fixed in holes bored through the socket body 1; and P denotes an electric part, such as an IC package, having leads L which are mounted on the mounting base 1b of the socket body 1 upon loading and each of which comes in contact with the contact portion 4a of the contact pin 4. Also, the cover 2 is constructed so that its upward movement is limited to the position shown in the figure by a locking mechanism, not shown, placed between the socket body 1 and the cover 2.

The loading of the electric part P at the position shown in the figure and its unloading therefrom are performed by pressing down the cover against the resilience of the spring 3. Specifically, when the cover is pressed down from the position of the figure, the trigger portion 4b is displaced outwardly, by the cam 2b, to the position indicated by a chain line in FIG. 1, against the resilience of the spring portion 4c. At the same time, the contact portion 4a is moved outwardly to the position indicated by a corresponding chain line to retire from the position held by each lead L of the electric part P.

This outward movement for the retirement of the contact portion 4a is also performed in cacti of the right-hand contact pins, not shown, arranged symmetrically with respect to the contact pins 4, and thus in this state, it becomes possible that the electric part P is mounted on, or dismounted from, the mounting base 1b. Subsequently, the downward pressure of the cover 2 is released, and thereby the cover 2 and the contact pin 4 are returned to the positions indicated by solid lines in virtue of the restoring force of the spring 3 and its own biasing force, respectively. In this way, the loading or unloading of the electric part P is completed.

In the conventional socket for electric parts, as mentioned above, the trigger portion 4b of the contact pin 4 is in general located away from the center of the socket body 1, that is, close to the outer side of the socket body 1. This position of the trigger portion 4b is disadvantageous when the socket body is made small in size. Thus, to compactly design the socket body, it is considered that the trigger portion is located closer to the center of the socket body. In this case, however, it is imperative that the center of turning of the contact pin 4 is situated nearly below the center of the socket body 1 because of its inner structure. Hence, the problem is produced that an open angle of the contact portion 4a where the cover 2 is pressed down becomes smaller, and when the downward pressure of the cover 2 is released to return each contact pin to its original position, the contact portion 4a catches in each lead L of the electric part P.

Furthermore, in order to improve the stability of contact between the contact portion 4a of each contact pin 4 and the lead L of the electric part P, the socket for electric parts of this type requires a wiping action, as it is usually called, to slide the contact portion 4a along the lead L, upon loading. In order to increase the efficiency of this wiping action, it is necessary to minimize an angle of advance $\theta$ (FIG. 2) made by the contact portion 4a with the lead L when the downward pressure of the cover 2 is released. However, if the angle of advance $\theta$ is made small, a case may crop up in which the contact portion 4a strikes the end face of the lead L (see FIG. 2) and is not smoothly seated on the lead L.

In the shop in which the electric parts like IC packages are mass-produced, where the socket of this type is used to carry out the performance tests of produced electric parts, the operations of the downward pressure of the cover 2 and the release therefrom are repeatedly performed and consequently, the contact pin 4 is repeatedly oscillated between the positions indicated by the solid and chain lines. In general, the contact pin 4 is constructed of thin electrically conductive material such as beryllium copper, and thus is liable to produce a stress, particularly in the arcuate spring portion 4c, because of the repeated oscillating motion of the contact pin 4.

For each contact pin 4 used in the conventional socket, the arcuate spring portion 4c is constant in width. Thus, in each of the conventional contact pins, since stress concentration is liable to occur in a particular part of the arcuate spring portion 4c, the fracture rate of the arcuate spring portion 4c is extremely high. Even though it is not fractured, the spring force of the arcuate spring portion 4c will be reduced, and thus the pressure or contact between the arcuate spring portion 4c and each lead L of the IC package will be decreased, frequently causing inconvenience to the examination and performance test of the electric part.

FIG. 3 shows the result of the simulation of stress distribution in the conventional contact pin. High stresses are concentrated in regions R1 and R2 of hatching portions. The stress concentration is brought about along the arcuate spring portion 4c, and tends to increase in going from a connection between the contact portion 4a and the trigger portion 4b to the base portion 4d.

SUMMARY OF THE INVENTION

It is, therefore, a primary object of the present invention to provide a socket for electric parts which is designed so that even when the trigger portion of each contact pin is located closer to the center of the socket body for compactness, the open angle, subtended upwardly and outwardly, of the contact portion of the contact pin where the cover is pressed down can be made sufficiently large.

Another object of the present invention is to provide a socket for electric parts which is equipped with contact pins having satisfactory durability and enabling a high contact pressure to be ensured with respect to the leads of the electric part.

Still another object of the present invention is to provide a socket for electric parts which is designed so that, upon loading of the electric part, the contact portion of each contact pin can ride smoothly on each lead of the electric part to successfully carry out a wiping action.

In order to achieve the first object, the socket for electric parts according to the present invention is such that the spring portion of each contact pin is configured, with a convex side facing the center of the socket body, and the trigger portion extends in a tongue piece shape toward the center of the socket body or is shaped into an arcuate convex directed toward the center of the socket body.

According to the present invention, the cover is provided with a cam face so that when the cover is pressed down, each contact pin is moved outwardly by a co-operation between the cam face and the trigger portion, or a slider is provided which is mounted to slide freely on the socket body and abuts against the cam face, and when the cover is pressed down, each contact pin is moved outwardly by the co-operation between the cam face and the slider.

Further, the socket for electric parts of the present invention is such that the spring portion or each contact pin is configured to be convex toward the center of the socket body, and the trigger portion, following the spring portion, is shaped into an arcuate convex directed toward the center of the socket body.

Still further, according to the present invention, the region of a connection between the trigger portion and the contact portion of each contact pin is extended in the opposite direction of the contact portion so that the extension end of the connection region is seated on the socket body and when the contact pin is moved back and forth, the contact portion is turned, with a center at a point of contact between the extension end and the socket body.

In order to achieve the second object, the socket for electric parts according to the present invention is such that the arcuate spring portion of each contact pin is configured so that its width increases progressively in going from the upper end to the lower end.

In order to achieve the third object, the socket for electric parts according to the present invention is such that the end edge of the contact portion of each contact pin contacting with each lead of the electric part is configured to incline with respect to the upper face of the lead so that the end edge of the contact portion rides on the upper face of the end edge of the lead.

These and other objects as well as features and advantages of the present invention will become apparent in the following description of the preferred embodiments when taken in conjunction with the accompanying drawings.

BRIEF DESCRIPTION OF THE DRAWINGS

FIG. 8 is a partially enlarged view, similar to FIG. 7, showing a second embodiment of the socket for electric parts according to the present invention;

FIG. 9 is a sectional view, similar to FIG. 5, showing a third embodiment of the socket for electric parts according to the present invention;

DESCRIPTION OF THE PREFERRED EMBODIMENTS

Figure 1:
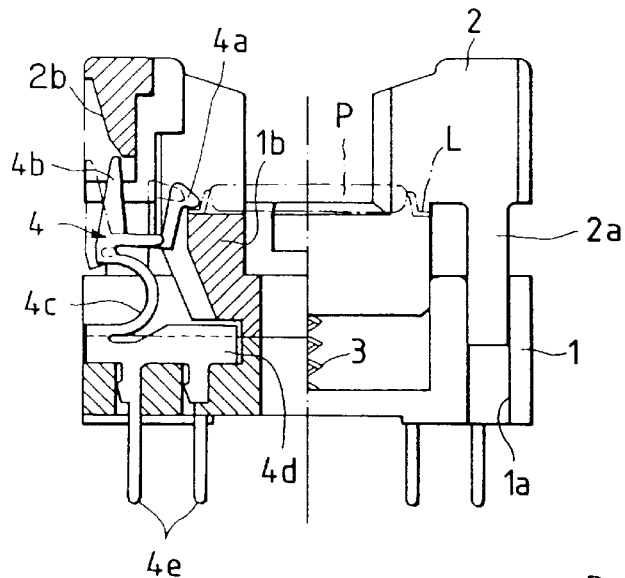
FIG. 1 is a front view showing an example, with the left-hand side as a section, of a conventional socket for electric parts.
Figure 2:
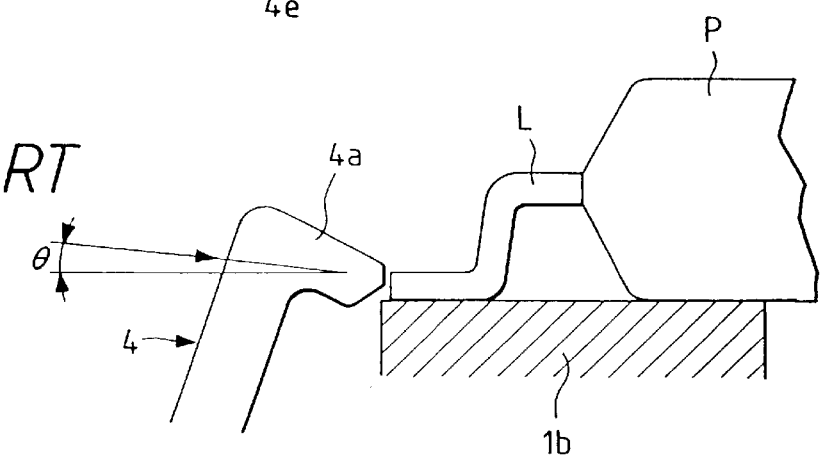
FIG. 2 is an enlarged front view showing essential parts for explaining the operation of each of contact pins incorporated in the socket of FIG. 1.

Referring to FIG. 4 through FIG. 7, the first embodiment of the present invention is explained. In this explanation, like numerals are used in like or similar members and parts shown in FIG. 1, and the description of like or similar structural parts is omitted.

In this embodiments, the cam 2b is configured on the side face of the cover 2 which projects into the socket body 1, and the trigger portion 4b of each contact pin 4 extends, in a tongue piece shape, inside the socket body 1, namely toward the center thereof, so as to engage the cam 2b of the cover 2. The contact pin 4 is provided with an arcuate portion 4f of small diameter which is configured between the trigger portion 4b and the arcuate spring portion 4c and is seated to slide freely on an arcuate depression 1c provided in the socket body 1.

Figure 5:
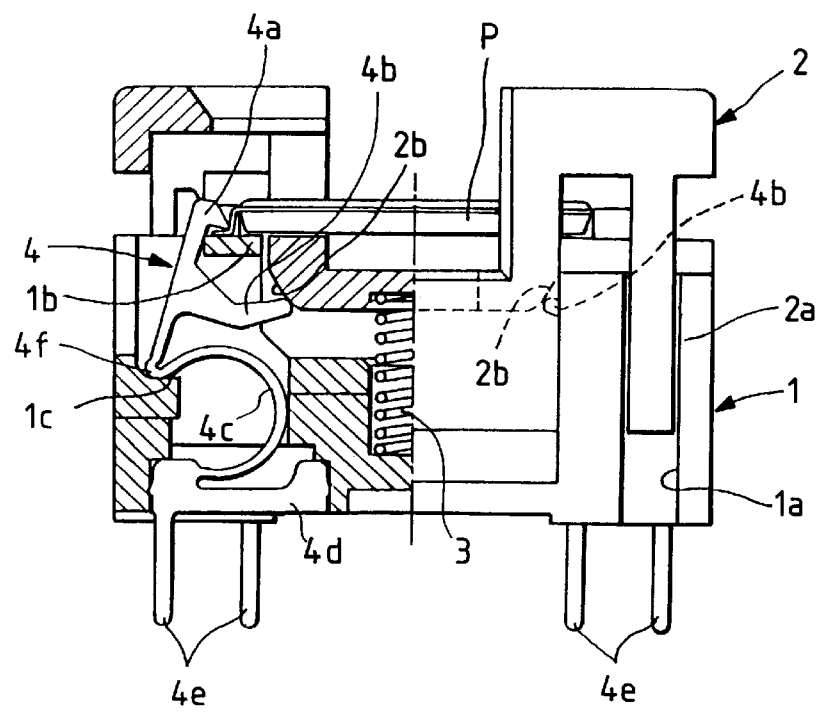
FIG. 5 is a sectional view taken along line V—V in FIG. 4.
Figure 6:
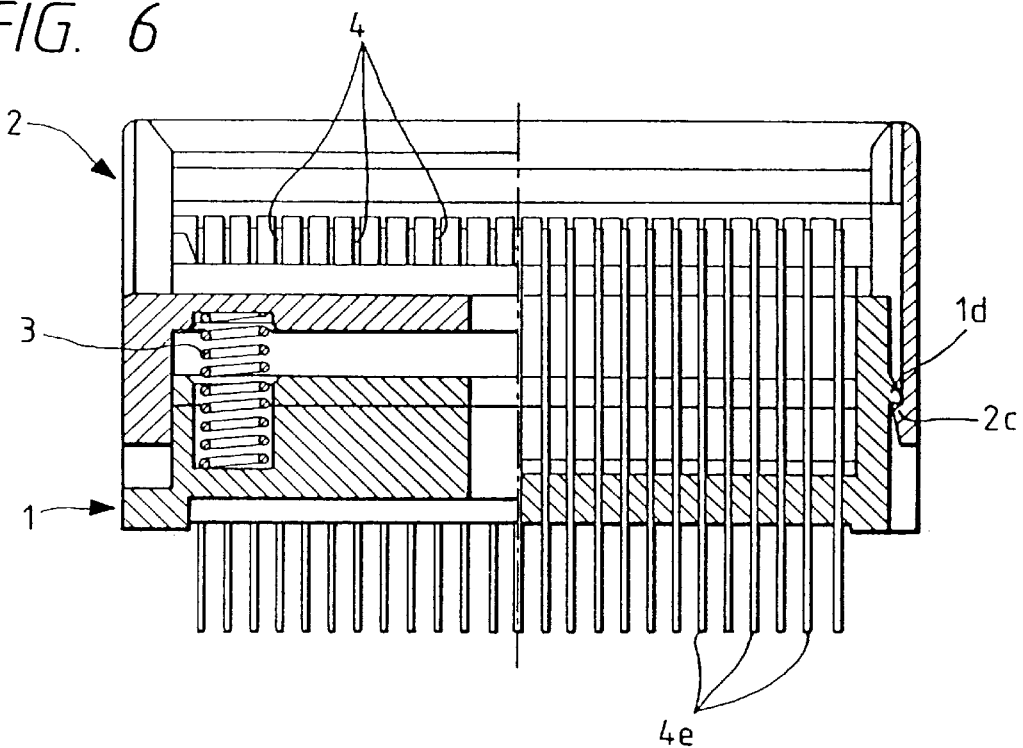
FIG. 6 is a sectional view taken along line VI—VI in FIG. 4.

The cover 2, as shown in FIG. 6, is designed so that its upper limit for movement is fixed at the position of the figure by the engagement of a claw 1d configured in the socket body 1 with a hook 2c provided in the cover 2, while each contact pin 4, as shown in FIG. 5, is such that when the electric part P is mounted on the mounting base 1b and the cover 2 is located at the position of the upper limit (non-pressure), the tip of the contact portion 4a is pressed against each lead L of the electric part by the resilience of the contact pin 4 itself.

The first embodiment is constructed as mentioned above, and thus when the cover 2 is pressed down in order to unload the electric part from the loading position shown in FIG. 5, the trigger portion 4b is pushed by the cam 2b and the contact portion 4a of the contact pin 4 is turned outwardly against its biasing force, with the center of the arcuate portion 4f as a substantial supporting point. Subsequently, when the cover 2 is fully pressed down, the contact pin 4 is moved to the position indicated by a chain line in FIG. 7, so that the contact portion 4a retires outwardly from the end of the lead L of the electric part P. In this way, the electric part can be removed upwardly. It is needless to say that this state also allows loading of the electric part.

As is obvious from the above description, the center of turning of the contact portion 4a can be shifted upwardly and outwardly, in spite of the fact that the arcuate spring portion 4c, as well as the trigger portion 4b, is located closer to the center of the socket body 1, that is, inside the socket body 1. Thus, although the size of the entire socket can be made smaller, the open angle, subtended upwardly and outwardly, of the contact portion 4a can be greatly increased. Consequently, the socket for electric parts can be provided which is small in size but allows the loading and unloading of the electric part to be carried out easily and surely.

FIG. 8 shows the second embodiment of the present invention. This embodiment is the same as the first embodiment with the exception that the trigger portion 4b of each contact pin 4 is eliminated and instead, by a slider 5 sliding along the cam 2b, the contact portion 4a is turned. Specifically, the slider 5 is mounted to slide freely on a support 1e provided in the socket body 1 and is shaped into a plate-like body, extending along the longitudinal direction of the socket body 1, the front end of which includes numerous slits 5a movably incorporating individual parts of the contact pins 4, arranged at the same pitch as in the contact pins, and the rear end of which abuts against the cam 2b.

The second embodiment is constructed as mentioned above, and thus when the cover 2 is pressed down and the cam 2b is lowered, the slider 5 is shifted to the left from the position of the figure to turn the contact portion 4a of each contact pin outwardly as in the first embodiment. Subsequently, when the downward pressure of the cover 2 is released, the contact portion 4a is returned to the position of the figure in association with an inward restoring motion by its own biasing force. In this way, the second embodiment has the same function and effect as in the first embodiment.

In the second embodiment, if a projection is provided above the position of the engagement of the contact pin 4 with the slider 5 so that the slider 5 is inclined to keep the left-hand side up in the figure, the contact portion 4a of the contact pin 4 will be moved while being forcedly raised up by the operation of the slider 5, and the open angle can be made larger.

Figure 7:
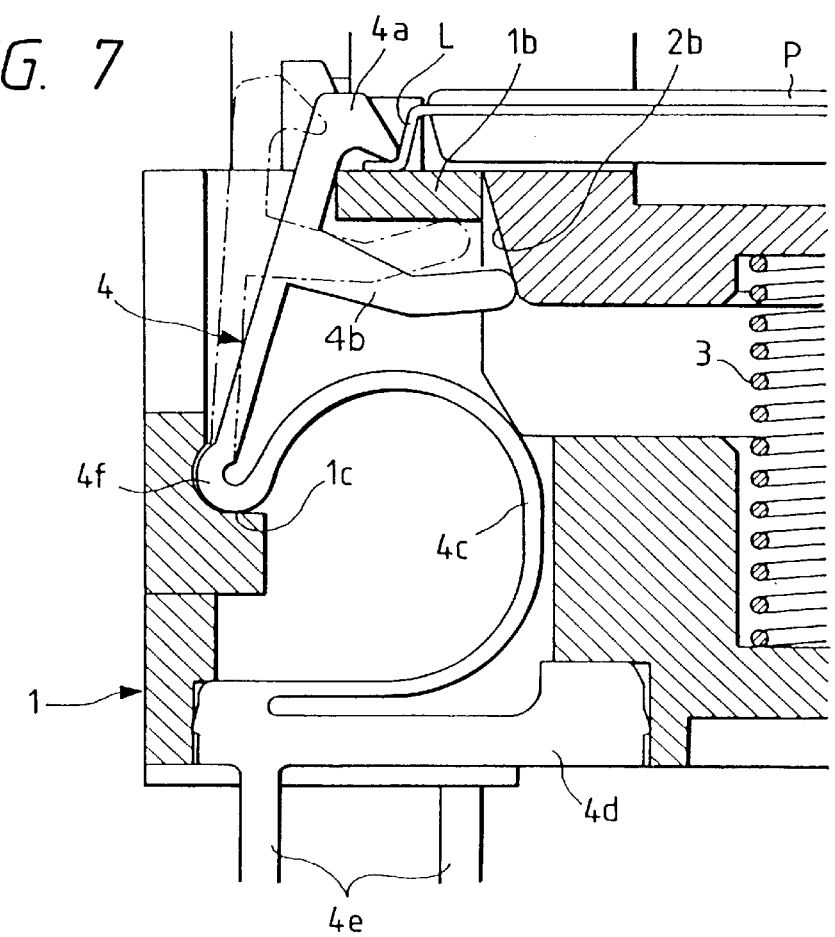
FIG. 7 is a partially enlarged view for explaining the operation of the contact pin of FIG. 5.

FIG. 9 shows the third embodiment of the present invention. This embodiment is the same as the first embodiment with the exception that a trigger portion 4b' is shaped into an arcuate form and connected directly to the arcuate spring portion 4c, and the region of a connection of the trigger portion 4b' with the contact portion 4a is extended in the opposite direction of the contact portion 4a so that its extension end 4d' is seated on the arcuate depression 1c. Since, however, the function and effect of the third embodiment are substantially the same as those of the first embodiment, their explanation is omitted, but the third embodiment has the advantage that a portion abutting against the cam 2b is arcuate and thus its movement can be more smoothly made. Also, even if the first embodiment shown in FIG. 7 is designed so that the small arcuate portion 4f of the contact pin 4 seated on the depression 1c of the socket body 1 is eliminated and the spring portion 4c is connected directly to the contact portion 4a and the trigger portion 4b, it is possible to increase the open angle of the contact portion 4a because of the spring portion 4c provided inside.

Figure 10:
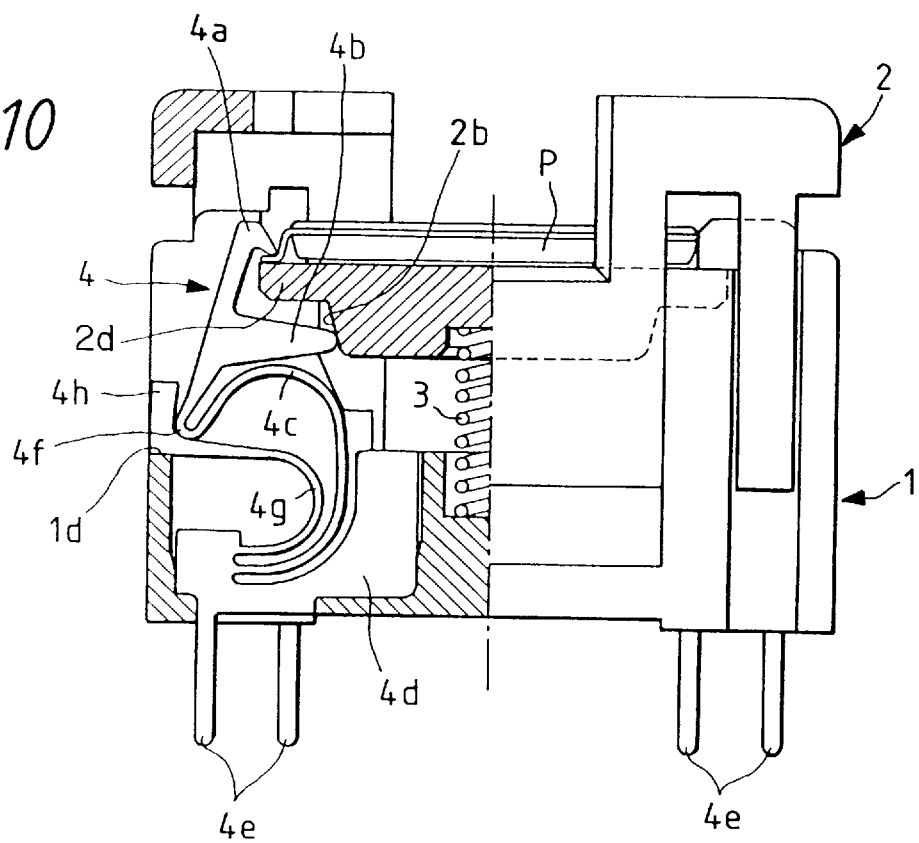
FIG. 10 is a sectional view, similar to FIG. 5, showing a fourth embodiment of the socket for electric parts according to the present invention.

FIG. 10 shows the fourth embodiment of the present invention. This embodiment is the same as the first embodiment with the exception that an auxiliary arcuate spring portion 4g configured, outside the arcuate spring portion 4c, to be convex toward the center of the socket body and an upright portion 4h provided at the tip of the arcuate spring portion 4g are added to the contact pin 4, and an electric-part mounting base, as denoted by reference numeral 2d, is configured in the cover 2. Since, however, the function and effect of the fourth embodiment are substantially the same as those of the first embodiment, their explanation is omitted. However, the fourth embodiment has the advantages that each contact pin 4, when assembled in the socket body 1, is inserted from above the socket body 1 and can be surely force-fitted and fixed in a predetermined space, and hence not only is assembly work facilitated, but also the contact pin is not entirely separated from the socket body even where the socket is placed on a printed circuit board and then the board is moved with the socket. Although the contact pin is such that when it has been stamped, the arcuate portion 4f of small diameter separates from the receiving part of the auxiliary arcuate spring portion 4g, the underside of the upright portion 4h at the assembly stage is mounted, against its biasing force, on a top face 1d of the side wall of the socket body to hold the position shown in the figure, and thereby the arcuate portion 4f of small diameter of the contact pin is received directly by an arcuate face, as the receiving part, lying inside the upright portion 4h. Hence, there is another advantage that the turning motion of the contact portion 4a is more smoothly carried out.

Figure 11:
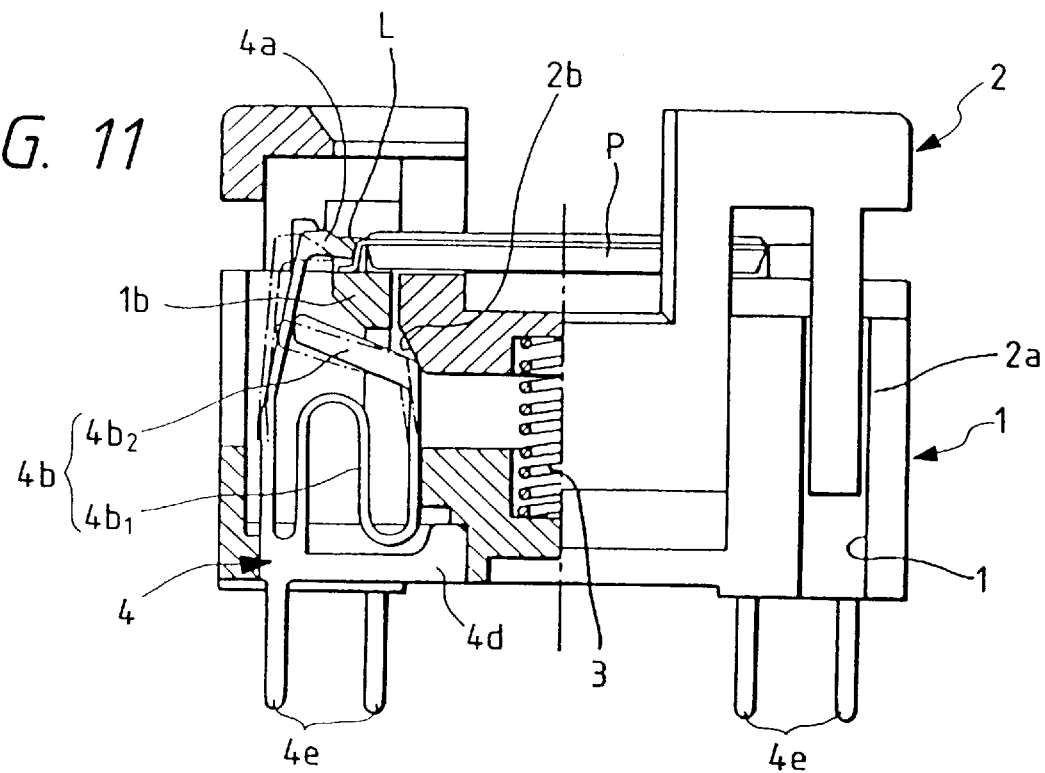
FIG. 11 is a sectional view, similar to FIG. 5, showing a fifth embodiment of the socket for electric parts according to the present invention.

FIG. 11 shows the fifth embodiment of the present invention. This embodiment is the same as the above embodiments with the exception that the contact portion 4a of the contact pin 4 is configured to rise up directly from the base portion 4d and shift toward the center of the socket body 1, and the trigger portion 4b is constructed with a relatively narrow, curved portion 4b1 which turns up after rising from the base portion 4d and zigzagging toward the center of the socket body 1, and a relatively wide, straight portion 4b2 which bends from the end of the curved portion 4b1 and extends straight toward the contact portion 4a so that its tip abuts against the inner edge of the contact portion 4a.

The fifth embodiment is constructed as described above, and thus when the cover 2 is pressed down in order to unload the electric part P from the loading position shown in FIG. 11, the straight portion 4b2 is pushed outwardly by the cam 2b and the contact portion 4a is also pushed outwardly, against its biasing force, by the tip of the straight portion 4b2. Subsequently, when the cover is fully pressed down, the contact portion 4a is moved to the position indicated by a chain line in FIG. 11, and the tip of the contact pin 4a is retired outwardly from the end of the lead L of the electric part P. In this way, it becomes possible to take out the electric part P upwardly. This state, of course, allows loading of the electric part P.

As is clear from the above description, the trigger portion 4b of the contact pin 4 is located closer to the center of the socket body 1 than the contact portion 4a, and therefore the entire socket becomes small in size; nevertheless, the open angle of the contact portion 4a can be greatly increased.

Moreover, the curved portion 4b1 of the trigger portion 4b is designed to provide sufficient resilience although its width is relatively narrow, while the straight portion 4b2 is relatively wide in width and extends in the direction in which the downward pressure is substantially applied to the contact portion 4a. Hence, the trigger portion 4b does not undergo buckling even when the contact pin is used over and over, and in addition, can be moved back and forth, smoothly and accurately, between the positions indicated by the solid and chain lines.

Also, although in the fifth embodiment a portion configured to have the resilience of the trigger portion 4b assumes such a curved shape that it zigzags vertically, it may zigzag laterally or need not necessarily zigzag if it has resilience.

Figure 12:
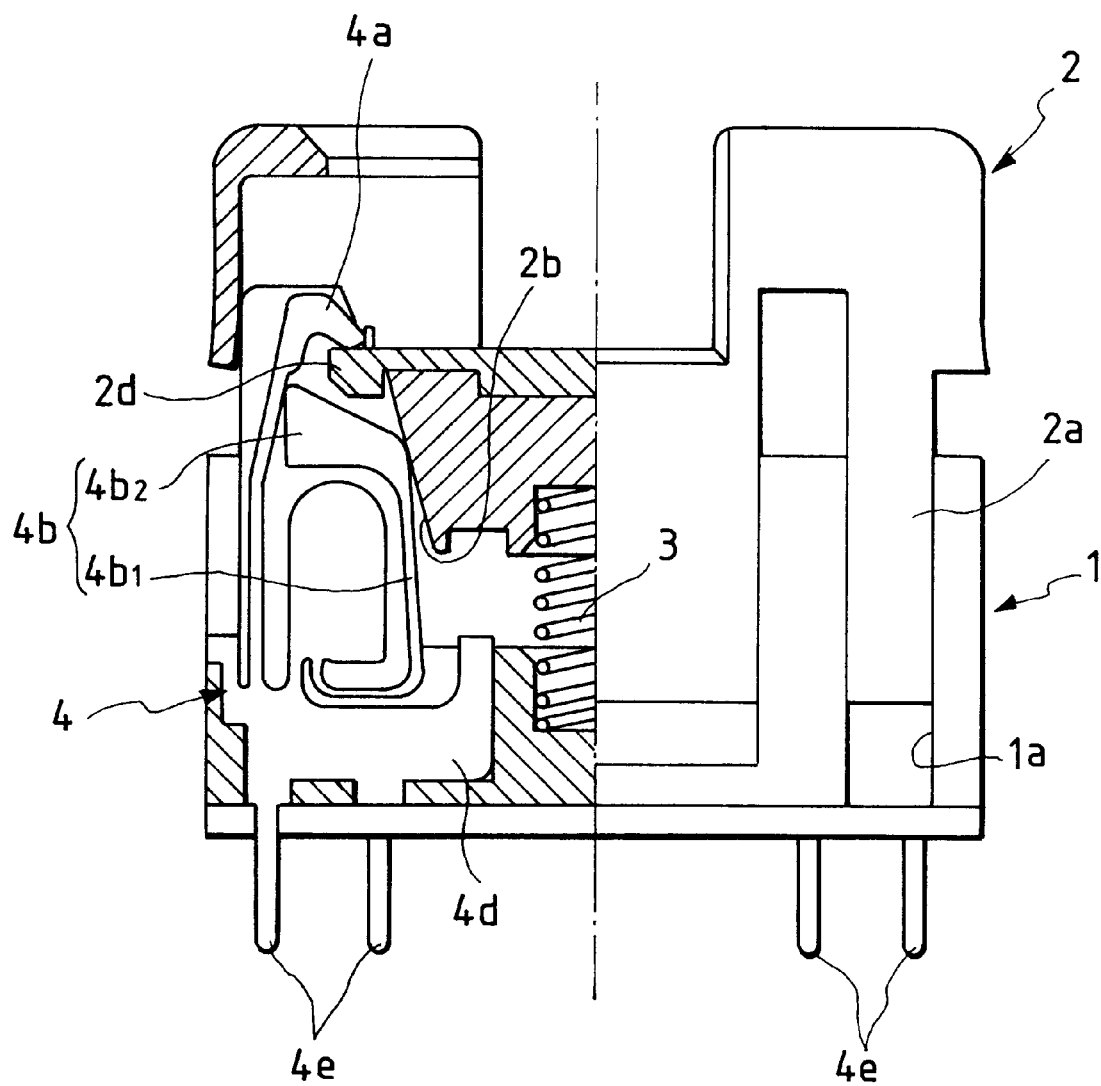
FIG. 12 is a sectional view, similar to FIG. 5, showing a sixth embodiment of the socket for electric parts according to the present invention.

FIG. 12 shows the sixth embodiment of the present invention. This embodiment is the same as the fifth embodiment with the exception that the curved portion 4b1 of the trigger portion 4b of the contact pin 4 is configured to include a relatively wide area, instead of the zigzag portion.

Since the sixth embodiment is constructed as in the foregoing, the strength of the trigger porting 4b is increased compared with that of the fifth embodiment, and the action of the trigger portion is more favorably exerted. The function of effect of the entire socket are the same as those of the fifth embodiment, and thus their detailed explanation is omitted.

Subsequently, the configuration of the contact pin 4 according to the present invention is described in detail.

Figure 13:
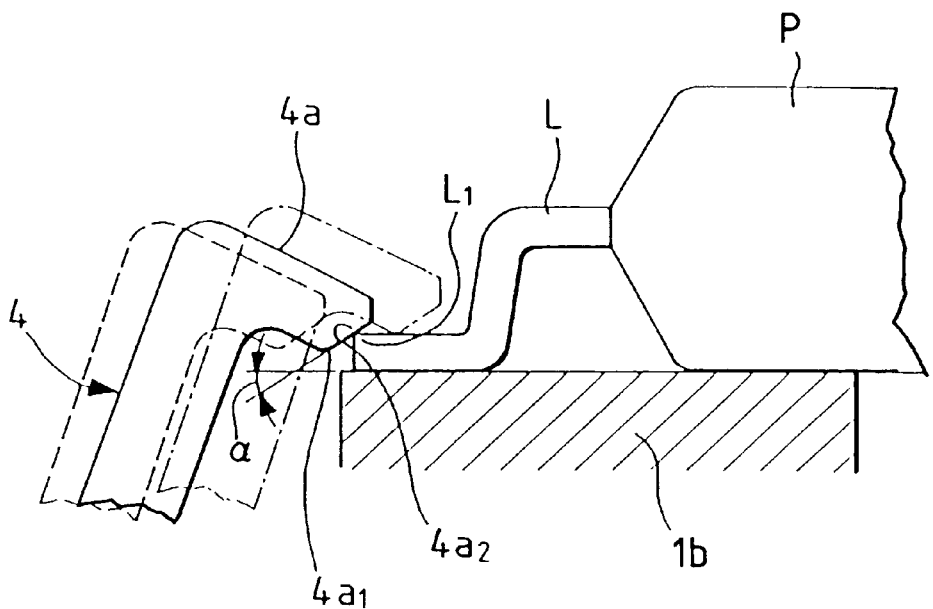
FIG. 13 is an enlarged front view showing essential parts for explaining the operation of an example of the contact pin according to the present invention.

According to the present invention, as depicted in FIG. 13, the contact portion 4a is configured with a straight edge 4a2 extending toward the tip from an arcuate contact end 4a1 sliding along the upper face of the lead L of the electric part P. The straight edge 4a2, when the cover 2 is fully pressed down, holds the position indicated by a broken line, and is inclined at an angle a with the upper face of the lead L, so as to ride on the upper face when the electric part P is mounted at a predetermined position of the mounting base 1b and the downward pressure of the cover 2 is released so that the straight edge 4a2 (indicated by a solid line) abuts against an upper corner L1 of the end edge of the lead L.

The contact portion 4a of the contact pin 4 is configured as mentioned above, and thus when the loading of the electric part P is completed and the downward pressure of the cover 2 is released, the contact pin 4 rides on the upper face of the lead L, by its own biasing force, from the position of the broken line through the position of the solid line, and reaches the position indicated by a chain line while wiping the upper face before it stops. As such, the contact portion 4a of the contact pin 4 will not catch in the end face of the lead L, and the electric connection of the arcuate contact end 4a1 with the lead L is made accurately and stably.

Figure 14:
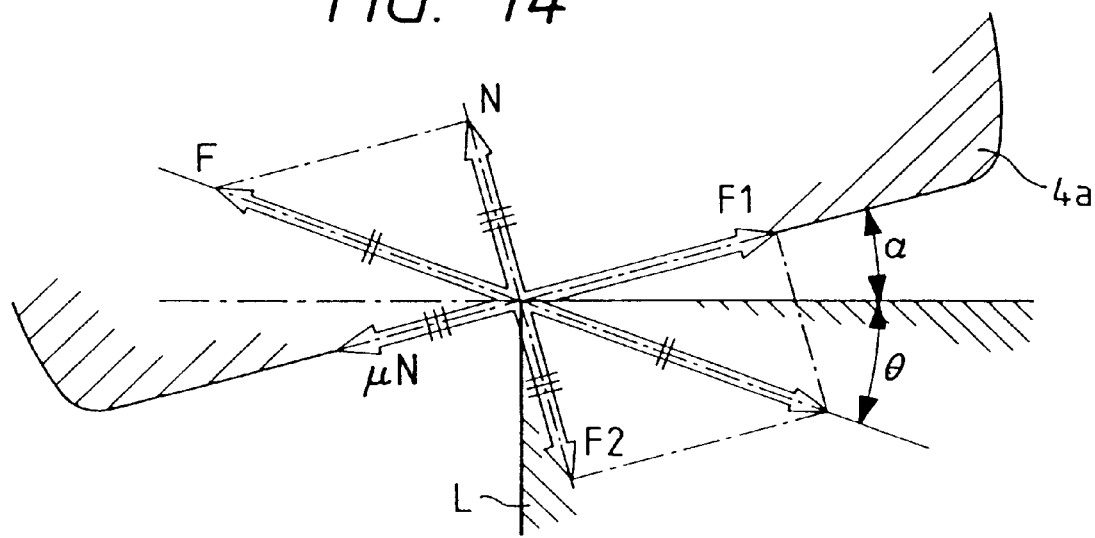
FIG. 14 is a view of an operation analysis of the contact pin in FIG. 13.

Referring now to FIG. 14, this electric connection is explained in detail, based on a specific example. Assuming that an angle of advance θ=20° a coefficient of kinetic friction $\mu$=0.3, a contact pressure F=40 g, and a contact-pin tip taper angle α=35°, and denoting a force of advance by F, a directional component of the contact-pin tip taper angle α by F1, a component in a direction normal to the component F1 by F2, and a normal reaction force applied to the contact pin by N, $$F1 = F[\cos(\alpha + \theta)]$$

$$F2 = F\{\sin[90-(\alpha+\theta)]\} = N$$

and therefore $$F1 = 40[\cos(35+20)] = 22.943$$

$$N = F2 = 40\{\sin[90-(35+20)]\} = 32.766$$

Here, in view of the balance between the coefficient of kinetic friction $\mu$ and the contact-pin tip taper angle α, if $$F1 > \mu N \quad (1)$$

the contact pin will slide upwardly.

Specifically, from the results of the above calculations, $$F1 = 22.943$$

$$\mu N = 0.3 \times 32.766 = 9.82$$

These values satisfy condition (1), and it is seen that when the taper angle α=35°, the contact pin slides upwardly.

Also, although in the embodiments the contact pin having the biasing force for inward movement has been described, it is needless to say that the present invention is not limited to such a contact pin but is also applicable to a contact pin having the biasing force for outward movement.

Figure 15:
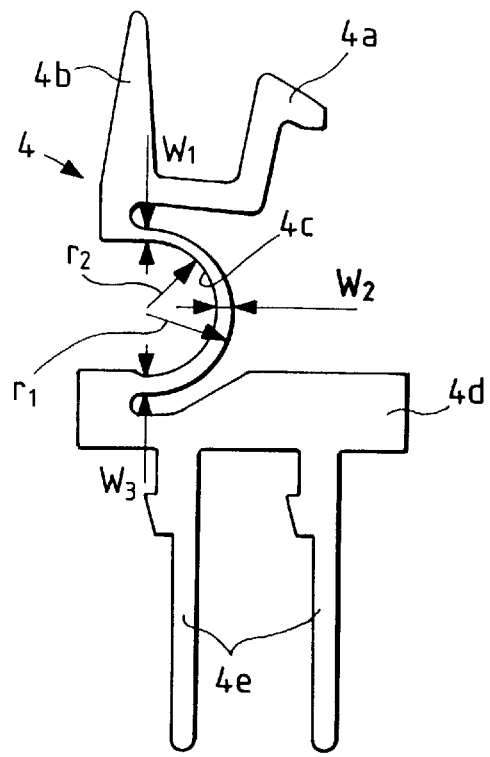
FIG. 15 is a front view showing another example of the contact pin according to the present invention.

FIG. 15 shows the contact pin 4 according to the present invention. As will be obvious from this figure, the contact pin 4 of the present invention is configured so that, in view of the results of the simulation of the conventional contact pin shown in FIG. 3, the width of the arcuate spring portion 4c increases progressively in going from the connection of the contact portion 4a with the trigger portion 4d to the base portion 4b.

Table 1 shows an example where widths W1, W2, and W3 of particular parts of the arcuate spring portion 4c in FIG. 15 are compared with those of the conventional contact pin.

TABLE 1

|       | Conventional contact pin | Contact pin of the present invention |
|-------|--------------------------|--------------------------------------|
| $W_1$ | 0.3                      | 0.28                                 |
| $W_2$ | 0.3                      | 0.33                                 |
| $W_3$ | 0.3                      | 0.38                                 |

Unit: mm

Figure 16:
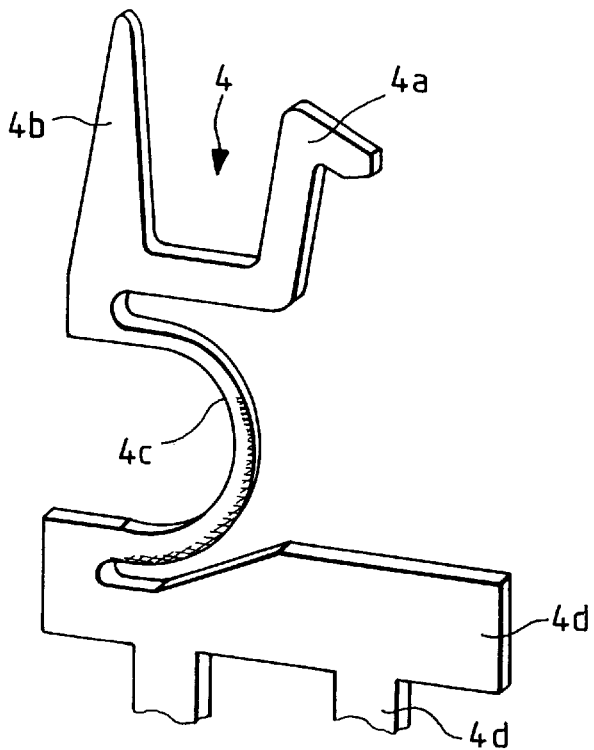
FIG. 16 is a perspective view for explaining the distribution of stresses produced in the contact pin of FIG. 15.

FIG. 16 shows the stress distribution (hatching portion) of the contact pin 4 of the present invention derived from the simulation. In the contact pin of the present invention, as will be obvious from the figure, the stress is distributed over the entire region of the arcuate spring portion 4c, and unlike the conventional contact pin, the stress is not concentrated in a particular part.

Figure 3:
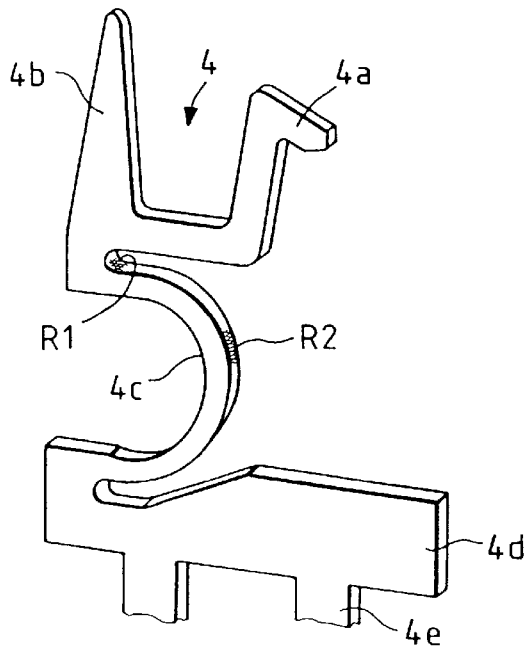
FIG. 3 is a perspective view for explaining the distribution of stresses produced in a conventional contact pin.
Figure 4:
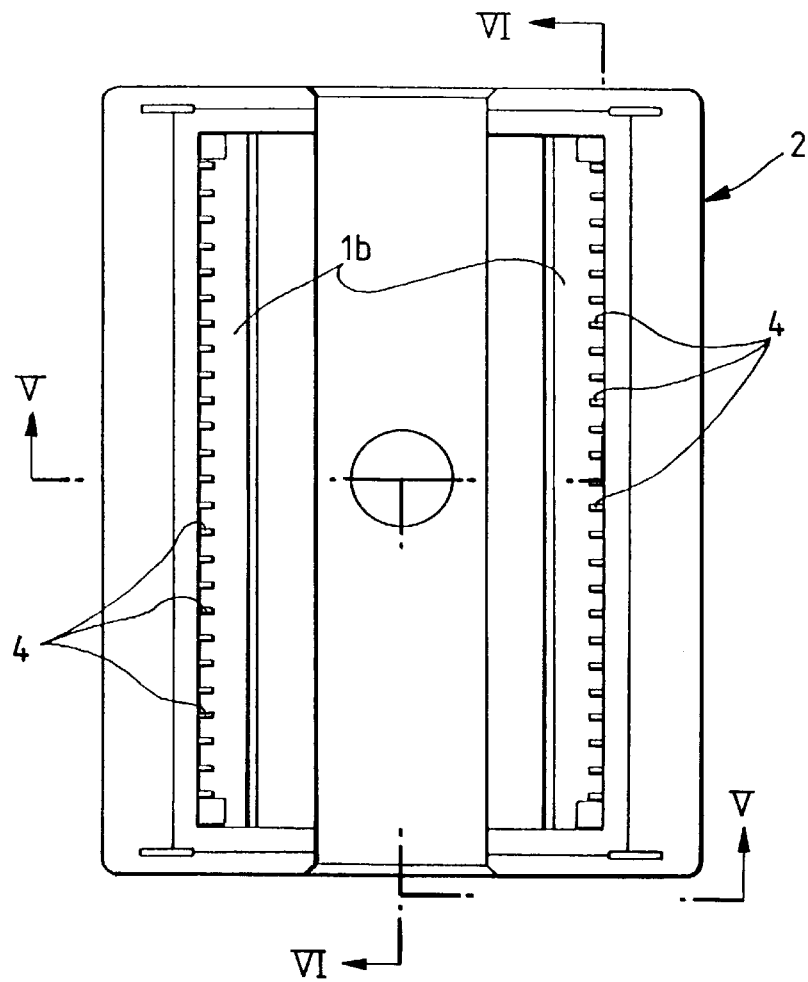
FIG. 4 is a plan view showing a first embodiment of a socket for electric parts according to the present invention.

Furthermore, in keeping with such stress distribution, the value of the maximum stress imposed on the spring portion 4c is lower than in the conventional contact pin. For example, the stress imposed on the stress concentration region R2 of the conventional contact pin shown in FIG. 3 is 87.1 g/cm$^3$, whereas the stress imposed on the corresponding part of the arcuate spring portion 4c of the contact pin 4 according to the present invention shown in FIG. 16 is 77.3 g/cm$^3$, which is lower by about 11%.

The technique of setting the width of the arcuate spring portion 4c of the contact pin 4 so as to increase progressively in going from the connection of the contact portion 4a with the trigger portion 4b to the base portion 4d can be arbitrarily adopted. For example, the width of the arcuate spring portion 4c may be determined to increase at a constant rate in proportion to a distance from the connection of the contact portion 4a with the trigger portion 4b. Alternatively, an outer circle of a radius r1 may be concentric to an inner circle of a radius r2 (refer to FIG. 15) so that the width of the arcuate spring portion 4c increases progressively.

In addition to the contact portion 4a, the trigger portion 4b, and the arcuate spring portion 4c, some of the contact pins of this type have an auxiliary contact portion which rises up directly from the base portion 4d to clamp the lead L of the electric part P in association with the contact portion 4a. The present invention can, of course, be applied to such contact pins.

In the embodiments, reference has been made to the socket suitable for a gull-wing IC package as the electric part P. However, it is needless to say that the present invention is not limited to this type of IC package, but can be constructed as a socket suitable for an SOJ type IC package.

What is claimed is:

1. A socket for electric parts, comprising:

a socket body having (1) a mounting face for mounting an electric part thereon and (2) an arcuate depression formed therein;

a plurality of contact pins arranged in said socket body, each having a contact portion, a trigger portion, and an arcuate spring portion; and a cover mounted on said socket body, said cover being movable up and down, wherein application of a downward force to said cover causes a portion of said cover at least indirectly to push the trigger portions of said contact pins, causing the contact portion of each of said contact pins to be moved against a biasing force thereof and allowing the electric part to be mounted on the mounting face, and wherein a removal of the downward force from said cover causes the contact portion of each of said contact pins to be returned substantially to an original position thereof such that said contact portion is pressed against a corresponding lead of the electric part mounted on the mounting face, and wherein each of said contact pins is formed to have an arcuate portion of small diameter between the arcuate spring portion and the trigger portion thereof, and wherein said arcuate portion of small diameter of at least one of said contact pins is seated to slide freely on said arcuate depression such that when the contact portion of said at least one of said contact pins is moved, said contact portion is turned, with a center of said arcuate portion of small diameter being a substantial supporting point.

2. A socket for electric parts, comprising:

a socket body having a mounting face for mounting an electric part thereon;

a plurality of contact pins arranged in said socket body, each having a contact portion, a trigger portion, and a spring portion; and a cover mounted on said socket body, said cover being movable up and down, wherein application of a downward force to said cover causes a portion of said cover at least indirectly to push the trigger portions of said contact pins, causing the contact portion of each of said contact pins to be moved against a biasing force thereof and allowing the electric part to be mounted on the mounting face, and wherein a removal of the downward force from said cover causes the contact portion of each of said contact pins to be returned substantially to an original position thereof such that said contact portion is pressed against a corresponding lead of the electric part mounted on the mounting face, and wherein a connecting region between the trigger portion and the contact portion of each of said contact pins is extended in a direction substantially opposite to that of the contact portion such that an end of said connecting region is seated on said socket body at a point of contact, and wherein when the contact portion of each of said contact pins is moved, said contact portion is turned, with the point of contact of the end of said connecting region with said socket body being a supporting point.

3. A socket for electric parts, comprising:

a socket body having a mounting face for mounting an electric part thereon;

a plurality of contact pins arranged in said socket body, each having a contact portion, a trigger portion, and an arcuate spring portion; and a cover mounted on said socket body, said cover being movable up and down, wherein application of a downward force to said cover causes a portion of said cover at least indirectly to push the trigger portions of said contact pins, causing the contact portion of each of said contact pins to be moved against a biasing force thereof and allowing the electric part to be mounted on the mounting face, and wherein a removal of the downward force from said cover causes the contact portion of each of said contact pins to be returned substantially to an original position thereof such that said contact portion is pressed against a corresponding lead of the electric part mounted on the mounting face, and wherein an arcuate portion of small diameter is formed between the arcuate spring portion and the trigger portion of each of said contact pins, and wherein each of said contact pins includes an arcuate receiving portion, said arcuate portion of small diameter being seated to slide freely on a corresponding said arcuate receiving portion, and wherein when the contact portion of each of said contact pins is moved, said contact portion is turned, a center of a corresponding said arcuate portion of small diameter being a substantial supporting point.

4. A socket for electric parts according to claim 1, 2 or 3, wherein the arcuate spring portion of each of said contact pins is configured so that a width thereof increases progressively toward a base portion of each of said contact pins.

5. A socket for electric parts according to claim 1, 2 or 3, wherein the trigger portion includes an arcuate or tongue-shaped piece extending toward the center of said socket body.

6. A socket for electric parts according to any one of claims 1, 2 or 3, wherein said cover is provided with a cam face so that when said cover is pressed down, each of said contact pins is turned outwardly by a co-operation between the cam face and the trigger portion.

7. A socket for electric parts according to claim 1, 2 or 3, wherein said cover is provided with a cam face, and a slider mounted to slide freely on said socket body, abutting against the cam face, is provided so that when said cover is pressed down, each of said contact pins is turned outwardly by a co-operation between the cam face and the slider.

8. A socket for electric parts according to claim 1, 2, or 3, wherein the arcuate spring portion of each of said contact pins is configured to be convex toward a center of said socket body, and the trigger portion of each of said contact pins is located close to the center of said socket body.

9. A socket for electric parts, comprising:

a socket body having a mounting face for mounting an electric Part thereon;

a cover mounted on said socket body, said cover being movable up and down, a plurality of contact pins, each having (1) a base portion fixed on said socket body, (2) a contact portion rising from the base portion and having a biasing force such that said contact portion is pressed against a corresponding lead of an electric part mounted on said mounting face, and (3) a trigger portion extending from said base portion such that a tip thereof abuts against an inner edge of said contact portion, while an intermediate portion thereof abuts against said cover; and wherein application of a downward force to said cover causes a portion of said cover at least indirectly to push the trigger portions of said contact pins, causing the contact portion of each of said contact pins to be moved against the biasing force thereof and allowing the electric part to be mounted on the mounting face, and wherein a removal of the downward force from said cover causes the contact portion of each of said contact pins to be returned substantially to an original position thereof such that said contact portion is pressed against a corresponding lead of the electric part mounted on the mounting face, wherein the trigger portion of each of said contact pins is shaped into (A) a relatively wide straight form in a range from a tip thereof to an intermediate part thereof and (B) a relatively narrow form in a range from the intermediate part to a base part thereof, said relatively narrow form having resilience, and wherein a portion of said relatively narrow form is shaped into a zigzag curved form.

10. A socket for electric parts according to claim 9, wherein when the electric part is mounted on the mounting face, an end edge of the contact portion of each of said contact pins contacting with each of the leads is configured to incline with respect to an upper face of each lead so that the end edge of the contact portion rides on an upper face of the end edge of the lead.

11. A socket for electric parts, comprising:

a socket body having (1) a mounting face for mounting an electric part thereon and (2) an arcuate depression formed therein;

a plurality of contact pins arranged in said socket body, each having a contact portion and an arcuate spring portion; and a cover mounted on said socket body, said cover being movable up and down, wherein application of a downward force to said cover causes a portion of said cover at least indirectly to push a portion of each of said contact pins, causing the contact portion of each of said contact pins to be moved against a biasing force thereof and allowing the electric part to be mounted on the mounting face, and wherein a removal of the downward force from said cover causes the contact portion of each of said contact pins to be returned substantially to an original position thereof such that said contact portion is pressed against a corresponding lead of the electric part mounted on the mounting face, and wherein each of said contact pins is formed to have an arcuate portion of small diameter between the arcuate spring portion and the contact portion thereof, and wherein said arcuate portion of small diameter of at least one of said contact pins is seated to slide freely on said arcuate depression such that when the contact portion of said at least one of said contact pins is moved, said contact portion is turned, with a center of said arcuate portion of small diameter being a substantial pivoting point.

12. A socket for electric parts according to claim 11, further comprising a slider mounted to slide freely on said socket body, wherein said cover is provided with a cam face, said slider abutting against said cam face such that application of the downward force to said cover causes said cam face to push against said slider, whereby the contact portions of each of said contact pins is moved against the biasing force thereof.

13. A socket for electric parts according to claim 11 or 12, each of said contact pins having a base portion, wherein the arcuate spring portion of each of said contact pins is configured so that a width thereof increases progressively toward the base portion of said contact pin.

* * * * *